United States Patent [19]

Simon et al.

[11] 4,383,731

[45] May 17, 1983

[54] OPTO-ELECTRONIC HEAD INCORPORATING A VERY SMALL DIAMETER OPTICAL FIBRE PORTION AND CONNECTION DEVICE INCORPORATING SUCH A HEAD

[75] Inventors: Jacques Simon; Bernard Defaut, both of Paris, France

[73] Assignee: Thomson-CSF, Paris, France

[21] Appl. No.: 188,492

[22] Filed: Sep. 18, 1980

[30] Foreign Application Priority Data

Sep. 21, 1979 [FR] France .................................. 79 23596

[51] Int. Cl.³ .................................................. G02B 4/14
[52] U.S. Cl. .................................. 350/96.18; 350/96.2
[58] Field of Search .......................... 350/96.18, 96.20

[56] References Cited

U.S. PATENT DOCUMENTS

| 4,193,663 | 3/1980 | Timmermann | 350/96.18 |
| 4,257,672 | 3/1981 | Balliet | 350/96.2 |
| 4,290,667 | 9/1981 | Chown | 350/96.18 |
| 4,302,070 | 11/1981 | Nakayama et al. | 350/96.19 |

*Primary Examiner*—Eli Lieberman
*Attorney, Agent, or Firm*—Oblon, Fisher, Spivak, McClelland & Maier

[57] ABSTRACT

An opto-electronic head serving as a connection between a photo-emitter or photo-detector component and a very small diameter optical transmission fibre, designed to facilitate the coupling and adjustment of the respective positions of the optical fibre and the component. To this end, the optical fibre is mounted in a fibre holder incorporating a relatively wide axial passage, except at a constriction point. The passage is flared in frustum-shaped manner on the diode surface side tangential to the fibre bulge maintaining said bulge at an optimum distance from said diode.

9 Claims, 4 Drawing Figures

OPTO-ELECTRONIC HEAD INCORPORATING A VERY SMALL DIAMETER OPTICAL FIBRE PORTION AND CONNECTION DEVICE INCORPORATING SUCH A HEAD

BACKGROUND OF THE INVENTION

The invention relates to a transmission and optionally reception head incorporating an optical fibre portion. It more particularly applies to an opto-electronic head using a light-emitting diode having a relatively large photoemissive surface and an only slightly directional radiation diagram coupled to a fibre with a diameter smaller than 400 microns, for example an optical fibre with a core diameter of 50 to 200 microns.

The invention also relates to a connection device incorporating such a head.

In optical telecommunications on the transmitter side, there is electronic modulation equipment, called the module and then an opto-electronic emission head associating a photoemissive diode with an optical fibre portion. This portion is generally very short and is incorporated in a fibre holder, which can constitute a male or female member of an optical fibre connector.

In the case of very short distance connections (a few dozen to a few hundred meters) a light emitting diode is generally joined to an optical fibre with a diameter exceeding 400 microns in an emission head using relatively simple and inexpensive conventional technology.

In the case of long distance connections (a few dozen to a few hundred kilometers and in the latter case with amplification at intermediate points) a laser-type diode is joined to a fibre of diameter 50 to 100 microns. The emission head is also of a conventional nature, but utilizes high precision and consequently high cost technology.

In the case of medium distance connections of a few kilometers, it would be economically interesting to use the same technology as for short distances and to join a low cost light-emitting diode to a small diameter optical fibre, namely less than 400 microns to obtain transmission quality characteristics permitting the connection without intermediate amplification.

Unfortunately, the use of this technology then becomes difficult due to a certain number of constructional problems and in particular:

1. As the light-emitting diode has approximately the same diameter as the optical fibre, maximum accuracy is necessary, particularly with regard to the centering of the diode and the fibre holder drill hole. In conventional technology, ordinary mechanical adjustments (in statics) do not make it possible to obtain this accuracy and adjustments must be carried out in operation on each individual head (in dynamics), i.e. whilst controlling the transmitted light. This procedure greatly increases the cost of the emission head.

2. As the optical fibre has a very small diameter and as the fibre holder must have a certain length so that it can function as a connector, the fibre holder must have a hole (approximately of diameter 200 microns) which cannot be drilled over such a length (a few millimeters) by conventional means.

BRIEF SUMMARY OF THE INVENTION

The invention makes it possible to at least partly obviate the above difficulties.

The invention therefore relates to an opto-electronic head incorporating a fibre holder surrounding a very small diameter optical fibre portion and a photo-emitting or photo-detecting diode fixed to a base rendered integral with the fibre holder, wherein the fibre holder has an axial channel whose diameter exceeds that of the fibre, except over a small part of its length and wherein the fibre portion has at its end on the diode side a spherical swelling or bulge.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
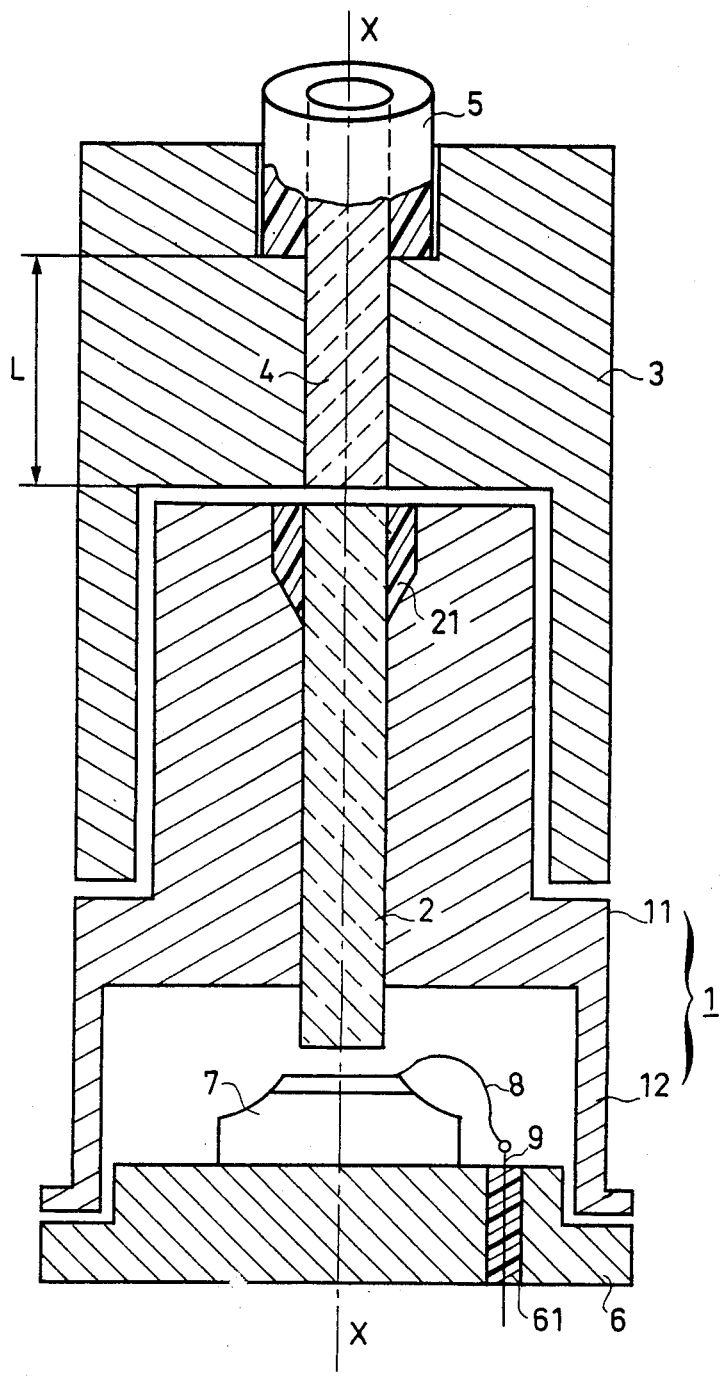
FIG. 1 in section, a conventional opto-electronic head.

In the device shown in FIG. 1, a fibre holder 1 contains an optical fibre portion 2. Fibre holder 1 has a part 11 which is to be fitted in a member 3 constituting a connecting terminal placed on an optical cable incorporating an optical fibre 4 and a sheath 5, the latter being removed over a length L at the end of the cable. When the members 1 and 3 are fitted together, the fibres 2 and 4 are placed in the extension of one another in accordance with an axis XX.

Fibre portion 2 has no protective sheath. A small amount of glue or resin is placed around the fibre in a funnel 21 located at the outlet of the axial passage of the fibre holder 1 (on the cable side). Fibre holder 1 has a part 12 in the form of a cylindrical sleeve which serves to receive a metal base 6 having a light-emitting diode 7 in its centre and whose emissive surface faces fibre 2. The diode is provided with a supply connection 8 welded to a conductive rod 9 passing through the base via an insulating passage 61.

Figure 2:
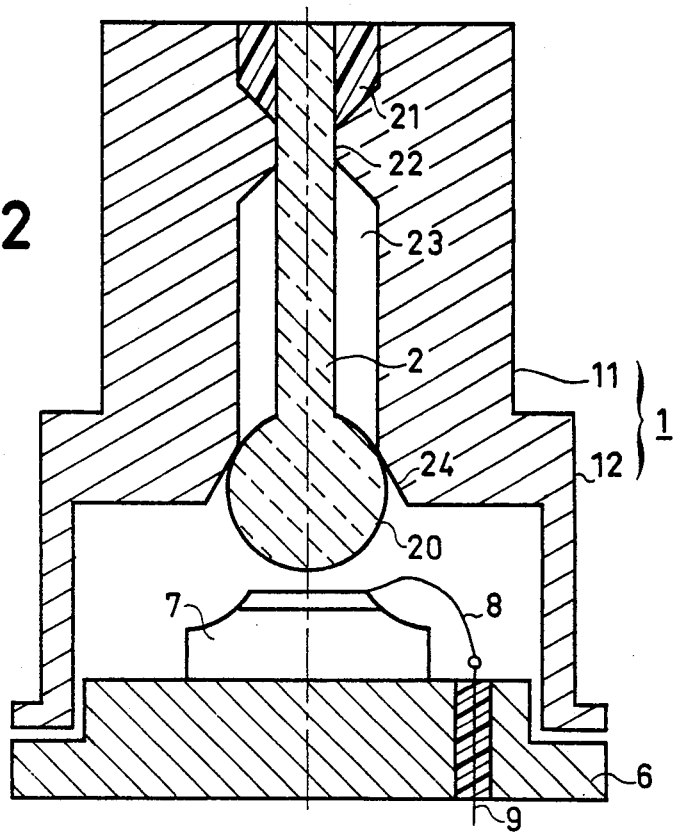
FIG. 2 a construction according to the invention.

In the construction according to the invention shown in FIG. 2, where the same reference numerals designate the same members as in FIG. 1, a fibre holder 1 has a smaller diameter funnel 21. This smaller diameter particularly applies at the point of connection to a part 22 having the same diameter as that of the fibre. This very short part 22 is followed by a relatively large diameter part 23 (at least 0.3 mm) which permits easy machining. Part 23 is itself followed by a flared part 24 for arresting a swelling or bulge 20 of fibre 2. The fitting of this fibre takes place by firstly threading the end of the fibre opposite to bulge 20 in part 22 of the passage into the latter until bulge 20 abuts against part 24. Fibre 2 is then tightened and fixed by placing resin or glue in funnel 21. After drying the latter, the fibre is cut and rendered flush at the outlet from funnel 21.

The formation of the spherical bulge 20 from a fibre portion can be carried out with a flame but can also be carried out industrially in a more reproducible manner using a "Fonbrune microforge" (Trade Name).

Figure 3:
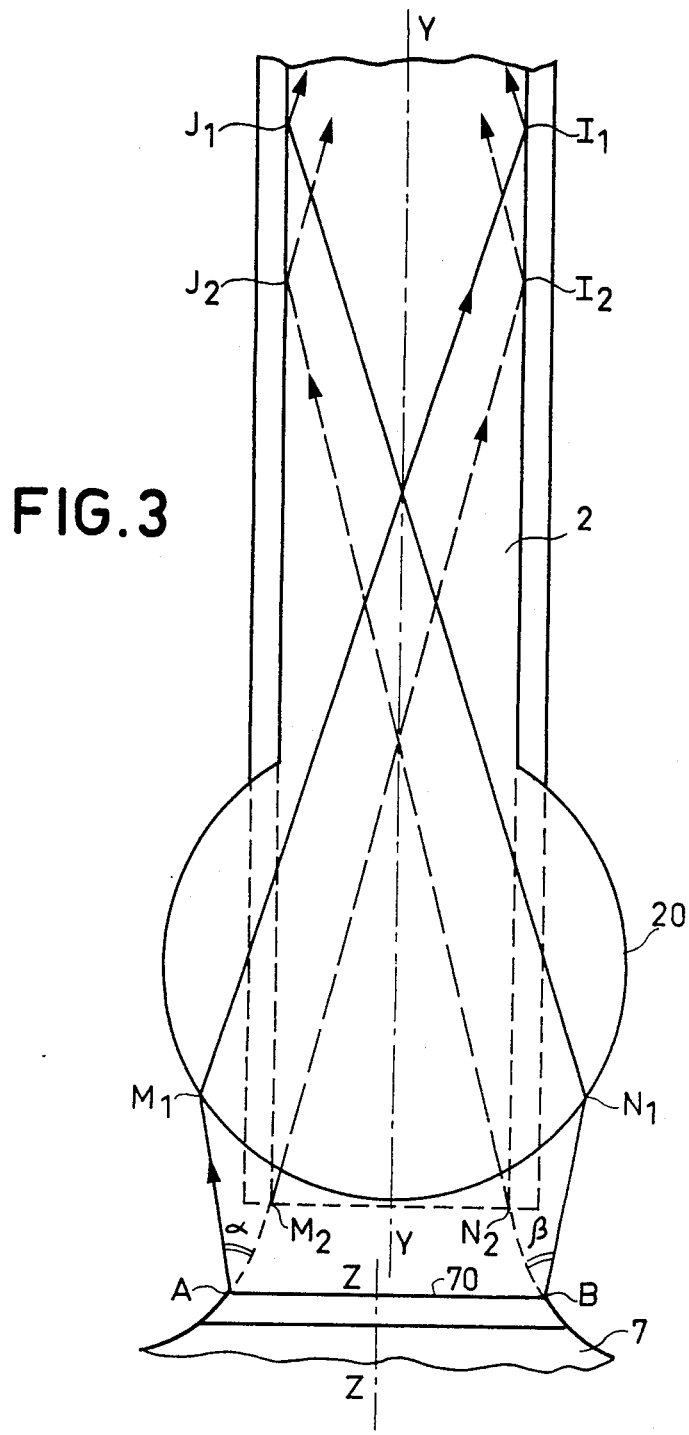
FIG. 3 an explanatory diagram.

The diagram of FIG. 3 at least partly explains the advantages of the invention. It is possible to see the useful light beam from the emissive face 70 of the light-emitting diode. In the case of the invention, a beam limited by the light rays $AM_1$ and $BN_1$ refracted by the bulge 20 in accordance with $M_1I_1$ and $N_1J_1$ is transmitted by optical fibre 2. In the case of the conventional solution, $AM_2$ and $BN_2$ ($M_2$ and $N_2$ designating the extreme useful points of an optical fibre without bulge) are refracted at $M_2I_2$ and $N_2J_2$ whilst limiting a light beam which is decidedly smaller than in the case of the invention. The larger the angles $\alpha$ and $\beta$ formed by the extreme radii of the opposite edges, the greater the light energy loss. This still applies when using an optical fibre of larger diameter than fibre 2, provided that the bulge 20 is sufficiently large. An adjustment of the optimum distance between the optical fibre bulge and the emissive surface of the diode can be carried out by inserting one or more washers between the base and the fibre holder.

A first advantage of the invention results from the fact that more light is trapped. This advantage is more marked in the case of a light-emitting diode, whose radiation diagram is "Lambertian" than with a more directional laser-type diode.

A second advantage of the invention is due to the fact that the respective axes YY and ZZ of the fibre and the diode can be displaced without significant light energy loss for an imprecision which can reach 50 microns.

Figure 4:
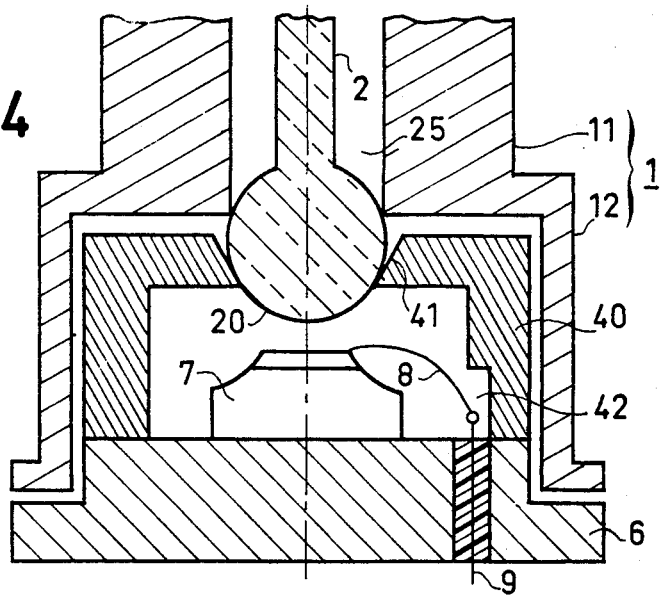
FIG. 4 a variant of the invention.

In a variant of the invention, parts 21 and 22 of the axial passage not shown in the partial section of FIG. 4 remain unchanged. However, part 23 is replaced by a larger diameter part 25 and flared part 24 is eliminated. A supplementary positioning part is mounted on base 6 and is constituted by support 40, which has a cylindrical portion welded to the base surrounding the diode 7 and allowing the light to pass through an opening 41 having inclined sides so as to be tangential to the bulge 20, which are best kept at a predetermined distance from diode 7. In the case of FIG. 4, a cutout 42 is made in support 40, which frees the rod 9 and facilitates connection of connection 8.

In other variants of the invention, very close to those of FIG. 2 or 4, the light-emitting diode is a photodetecting diode and the opto-electronic head then becomes a reception head or an EROS (Trade Name) type diode which alternately emits and detects light, when the opto-electronic head becomes a transmission—reception head.

What is claimed is:

1. An opto-electronic head comprising:
   an optical fiber having a first diameter and having at least a first portion extending along an axis, one end of said fiber adjacent said first portion defining a spheroid having a second diameter greater than said first diameter;
   a fiber holder including a bore in which said fiber is positioned, said bore including a first portion having a third diameter larger than said first diameter, and a second portion, axially smaller than said first portion, having a fourth diameter substantially equal to said first diameter wherein said fiber is held by said fiber holder only at said second portion and at said spheroid;
   a base fixed to said fiber holder; and
   a photo sensitive diode fixed to said base, said diode facing said spheroid and being in substantial alignment with said axis.

2. An opto-electronic head according to claim 1, wherein the diode is a light-emitting diode.

3. An opto-electronic head according to claim 1, wherein the diode is a photo-detecting diode.

4. An opto-electronic head according to claim 1, wherein the diode can be used both as a photo-emitter and as a photo-detector.

5. A connection device incorporating an opto-electronic head according to claim 1 including an optical fibre cable terminal, wherein the fibre holder of the head is fitted so as to join end to end the respective optical fibres of the head and the cable terminal.

6. The head of claim 1 wherein said first diameter does not exceed 400 microns.

7. The head of claim 1 wherein said first diameter is between 50 and 200 microns.

8. The head of claim 1 wherein said bore comprises along its length, beginning at an end closer to said diode:
   a first frustum shaped part flared toward said diode, said spheroid contacting said first frustum shaped part for positioning said spheroid;
   said first portion;
   said second portion; and
   a second frustum shaped part flared away from said diode, said second frustum shaped part being provided with means for fixing said fiber to said fiber holder.

9. The head of claim 1 including a support fixed to said base and having a frustum shaped opening, said spheroid being contacted by the edges of said frustum shaped opening for positioning said spheroid.

* * * * *